United States Patent
Yamamoto

(10) Patent No.: US 10,682,762 B2
(45) Date of Patent: Jun. 16, 2020

(54) MOVING BODY

(71) Applicant: FUJI CORPORATION, Chiryu-shi (JP)

(72) Inventor: Mizuho Yamamoto, Okazaki (JP)

(73) Assignee: FUJI CORPORATION, Chiryu-shi (JP)

( * ) Notice: Subject to any disclaimer, the term of this patent is extended or adjusted under 35 U.S.C. 154(b) by 162 days.

(21) Appl. No.: 15/560,802

(22) PCT Filed: Mar. 23, 2015

(86) PCT No.: PCT/JP2015/058713
§ 371 (c)(1),
(2) Date: Sep. 22, 2017

(87) PCT Pub. No.: WO2016/151724
PCT Pub. Date: Sep. 29, 2016

(65) Prior Publication Data
US 2018/0111269 A1    Apr. 26, 2018

(51) Int. Cl.
*G01C 21/00* (2006.01)
*B25J 9/16* (2006.01)
(Continued)

(52) U.S. Cl.
CPC .......... *B25J 9/1676* (2013.01); *B25J 9/1687* (2013.01); *B25J 19/06* (2013.01); *B60Q 1/143* (2013.01);
(Continued)

(58) Field of Classification Search
CPC ........ B25J 9/1676; B25J 9/1687; B25J 19/06; F16P 3/144; B60Q 1/00; G01S 17/936;
(Continued)

(56) References Cited

U.S. PATENT DOCUMENTS 9,678,148 B2 *  6/2017  Rogel-Favila ..... G01R 31/2867
10,081,107 B2   9/2018  Sakabe
(Continued)

FOREIGN PATENT DOCUMENTS

JP    1-222889 A    9/1989
JP    5-88746 A     4/1993
(Continued)

OTHER PUBLICATIONS

JPO English Transaltion: JP09-185413, Junpei et al (Year: 1997).*
(Continued)

*Primary Examiner* — Ian Jen
(74) *Attorney, Agent, or Firm* — Oblon, McClelland, Maier & Neustadt, L.L.P.

(57) ABSTRACT

An unmanned conveyance vehicle includes a monitoring section which includes, as monitoring regions for detecting obstacles, a first monitoring region and a second monitoring region which is capable of detecting obstacles that are more distant than the first monitoring region, and a light emitting section which emits light in the first monitoring region, in which when an obstacle is detected within the first monitoring region, a vehicle is caused to perform an emergency stop. Ordinarily, when the unmanned conveyance vehicle stops the light emission of the light emitting section and detects an obstacle within the second monitoring region, the unmanned conveyance vehicle causes the light emitting section to emit light. Accordingly, when an operator enters the second monitoring region, the operator is capable of recognizing a distance at which, when reached by the unmanned conveyance vehicle, the unmanned conveyance vehicle will perform the emergency stop.

11 Claims, 12 Drawing Sheets

(51) Int. Cl.
*B25J 19/06* (2006.01)
*G05D 1/02* (2020.01)
*F16P 3/14* (2006.01)
*B60Q 1/14* (2006.01)
*G01S 17/931* (2020.01)
*G01S 17/42* (2006.01)

(52) U.S. Cl.
CPC ............ *F16P 3/144* (2013.01); *G01S 17/931* (2020.01); *G05D 1/024* (2013.01); *B60Q 2300/45* (2013.01); *G01S 17/42* (2013.01); *G05B 2219/31005* (2013.01); *G05B 2219/50393* (2013.01); *G05D 2201/0216* (2013.01); *Y10S 901/01* (2013.01); *Y10S 901/47* (2013.01); *Y10S 901/49* (2013.01)

(58) Field of Classification Search
CPC ...... G01S 17/42; Y10S 901/49; Y10S 901/47; Y10S 901/01; G05D 2201/0216; G05D 1/024
See application file for complete search history.

(56) References Cited

U.S. PATENT DOCUMENTS

| | | |
|---|---|---|
| 2009/0043440 A1 | 2/2009 | Matsukawa et al. |
| 2011/0037963 A1 | 2/2011 | Weiss et al. |
| 2012/0218538 A1 | 8/2012 | Weiss et al. |
| 2012/0290132 A1 | 11/2012 | Kokubo et al. |
| 2013/0200916 A1* | 8/2013 | Panagas ................. H04M 1/24 324/757.01 |
| 2014/0207285 A1 | 7/2014 | Sakabe |
| 2014/0330433 A1 | 11/2014 | Ciarelli et al. |
| 2016/0223655 A1 | 8/2016 | Weiss et al. |
| 2016/0288687 A1* | 10/2016 | Scherle ................... B66F 9/063 |
| 2017/0129103 A1 | 5/2017 | Kokubo et al. |

FOREIGN PATENT DOCUMENTS

| | | | |
|---|---|---|---|
| JP | 9-185413 A | 7/1997 | |
| JP | 11-312016 A | 11/1999 | |
| JP | 2003-233423 A | 8/2003 | |
| JP | 2012-236244 A | 12/2012 | |
| JP | 2014-140920 A | 8/2014 | |
| WO | WO-2015112665 A1 * | 7/2015 | ........... B65G 1/0492 |
| WO | WO-2018224184 A1 * | 12/2018 | ............. B65G 1/065 |

OTHER PUBLICATIONS

Japanese Office Action dated Sep. 28. 2018 in Japanese Patent Application No. 2017-507187 (with unedited computer generated English translation), 6 pages.

International Search Report dated Apr. 14, 2015 in PCT/JP2015/058713 filed Mar. 23, 2015.

Extended European Search Report dated Feb. 13, 2018 in the corresponding European Application No. 15886279.7.

* cited by examiner (a)

(b)

MOVING BODY

TECHNICAL FIELD

The present disclosure relates to a moving body.

BACKGROUND ART

In the related art, in an unmanned vehicle (a moving body) which conveys a wagon truck, there is proposed one in which the periphery of the wagon truck is constantly monitored by a proximity detection device, and when the proximity detection device detects the proximity of an obstacle during the conveyance of the wagon, truck by the unmanned vehicle, the traveling of the unmanned vehicle is stopped (for example, refer to PTL 1). The unmanned vehicle emits multiple beams of visible light rays in the periphery of the wagon truck and renders a detection range of the obstacle detection such that it is possible to recognize an unspecified number of people in the vicinity thereof.

PTL 1: JP-A-09-185413

SUMMARY

However, in the moving body, since the emission of the beams is continued even in a case in which there are no people in the periphery, energy is wastefully consumed and this also poorly influences the lifespan of a light emitting section.

A main object of the present disclosure is to obtain energy savings and life extension of a light emitting section in a device that emits visible light in a detection range of obstacles.

The present disclosure adopts the following means in order to achieve the main object.

A moving body of the present disclosure includes detection means for enabling detection of an obstacle within a first region and detection of an obstacle within a second region that is closer to an outside than the first region moving body is set as a reference, light emitting means for emitting visible light, and light emission control means for controlling the light emitting means such that visible light is emitted in the first region in a case in which an obstacle is detected within the second region by the detection means and controlling the light emitting means such that visible light is not emitted in the first region in a case in which an obstacle is not detected within the second region by the detection means.

In the moving body, the second region which is capable of detecting an obstacle closer to the outside than the first region using the moving body as a reference is provided in addition to providing the light emitting means which is capable of emitting light in the first region, and in a case in which an obstacle is detected within the second region, the light emitting means is controlled such that visible light is emitted in the first region, and in a case in which an obstacle is not detected within the second region, the light emitting means is controlled such that visible light is not emitted in the first region. Accordingly, it is possible for an operator to recognize the presence of the first region. Since it is not necessary to always emit visible light in the first region, it is possible to obtain energy savings and life extension of the light emitting means.

In the moving body of the present disclosure, the moving body may further include movement stopping means for stopping movement in a case in which an obstacle is detected within the first region by the detection means.

In the moving body of the present disclosure, while an advancing direction of the moving body is being changed, the detection means may be capable of changing at least the first region according to the change in the advancing direction. By adopting this configuration, it is possible to appropriately monitor the presence or the absence of an obstacle even while the advancing direction of the moving body is being changed. In the moving body of the present disclosure of this mode, the moving body may be capable of moving along a movement route which is defined in advance and the light emission control means may be capable of emitting light in at least a region which will become the first region after the advancing direction of the moving body is changed before the change. By adopting this configuration, a person in the periphery is capable of recognizing that the advancing direction of the moving body is to be changed in advance. In this case, before the advancing direction of the moving body is changed, the light emission control means may be capable of emitting light in the region which will become the first region after the change and the first region before the change.

Furthermore, in the moving body of the present disclosure, the moving body may be a conveyance device which conveys a component supply device to an electronic component mounting machine which mounts electronic components which are supplied from the component supply device onto a board.

DESCRIPTION OF EMBODIMENTS

Next, description will be given of an embodiment of the present disclosure using an example.

Figure 1:
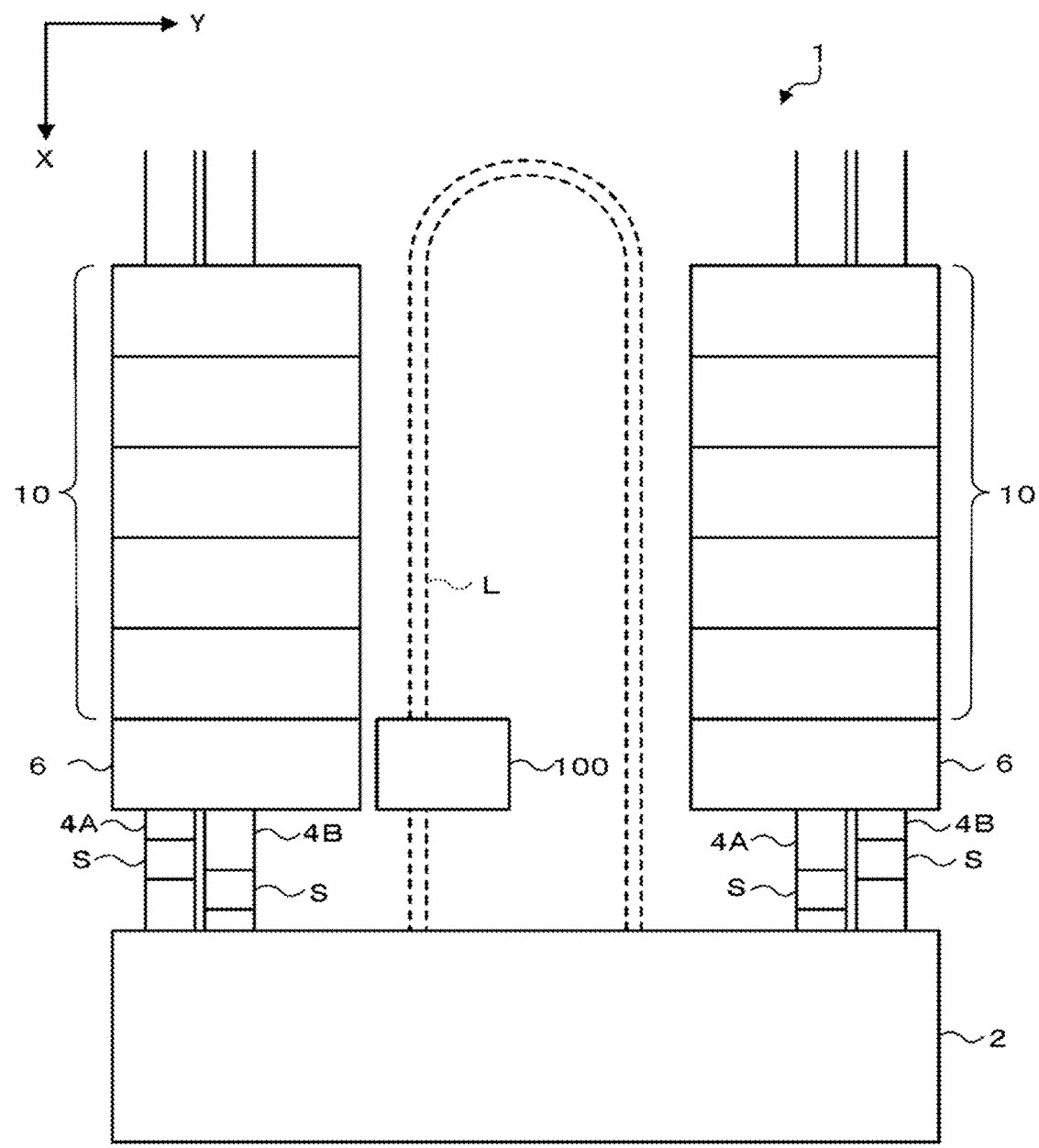
FIG. 1 is a configuration diagram schematically illustrating the configuration of a component mounting system 1.
Figure 2:
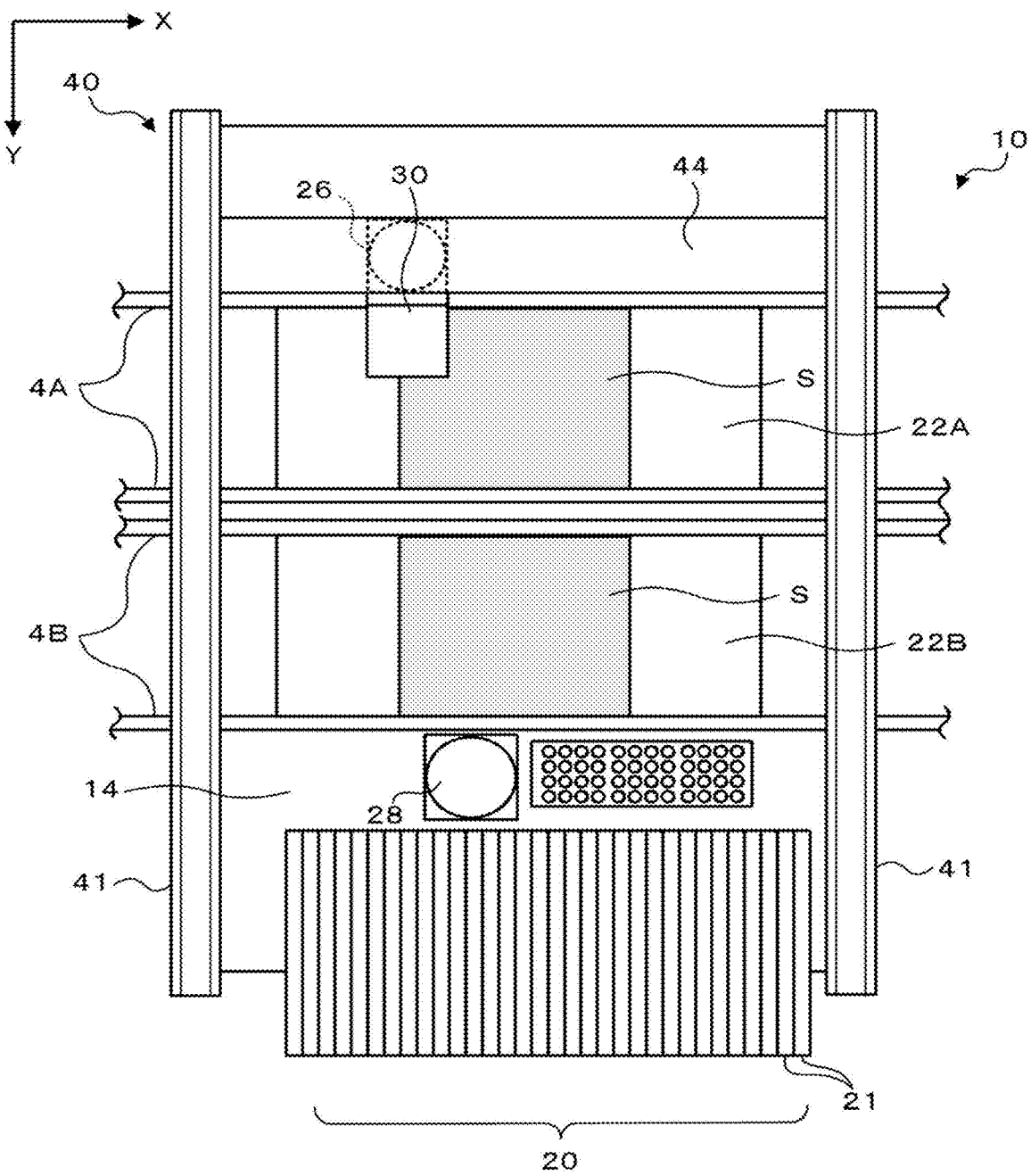
FIG. 2 is a configuration diagram schematically illustrating the configuration of a component mounting machine 10.
Figure 3:
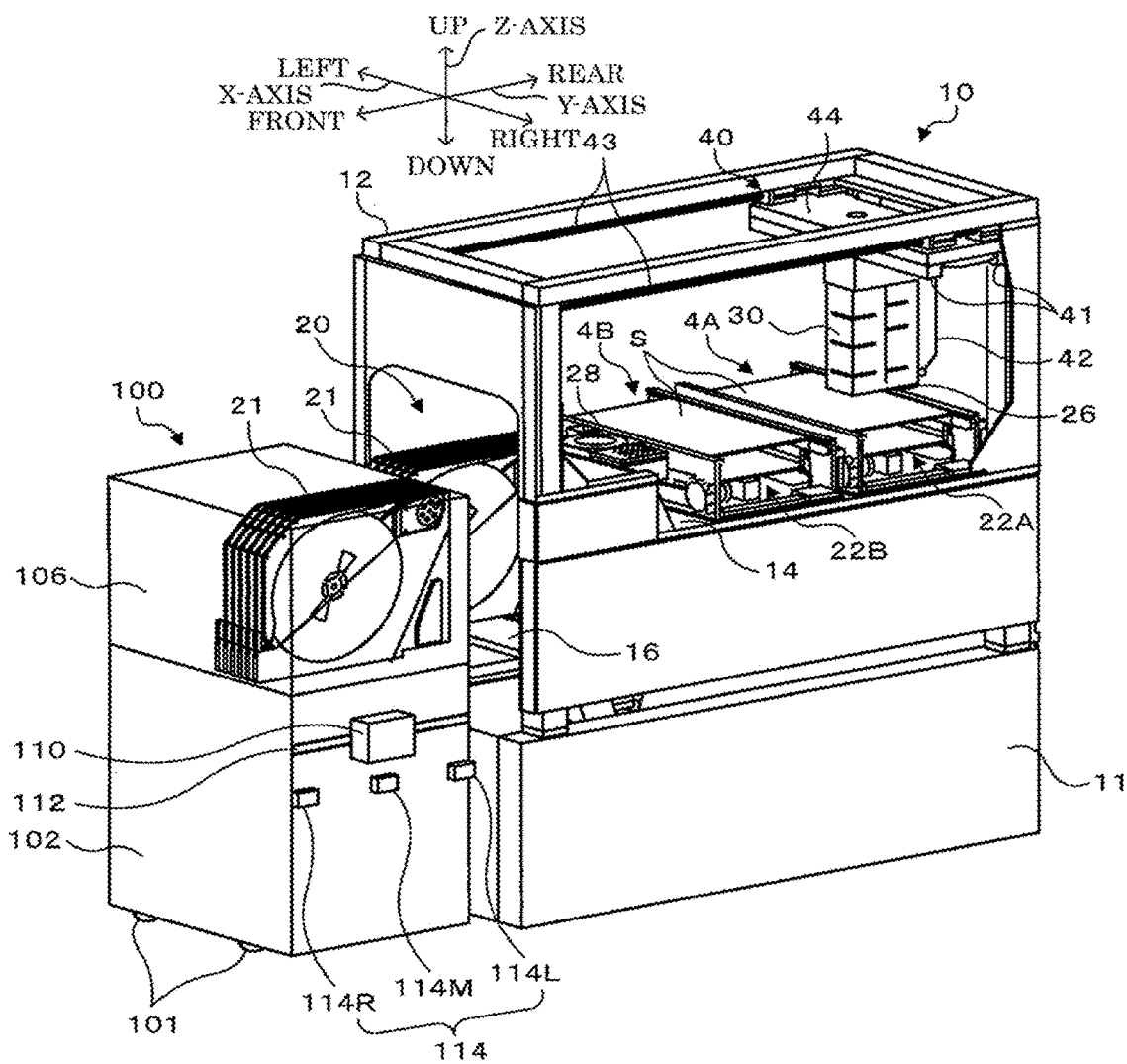
FIG. 3 is an external perspective view illustrating the external appearance of the component mounting machine 10 and an unmanned conveyance vehicle 100.

FIG. 1 is a configuration diagram schematically illustrating the configuration of the component mounting system 1, FIG. 2 is a configuration diagram schematically illustrating the configuration of the component mounting machine 10, and FIG. 3 is an external perspective view illustrating the external appearance of the component mounting machine 10 and the unmanned conveyance vehicle 100.

As illustrated in FIG. 1, the component mounting system 1 is provided with board conveyance devices 4A and 4B, board work machines such as printers 6 and component mounting machines 10, a storage container 2, and the unmanned conveyance vehicle 100. The board conveyance devices 4A and 4B convey circuit boards (hereinafter referred to as boards) S, the printer 6 prints solder onto the board S which is conveyed to form a wiring pattern on the board S, the component mounting machine 10 mounts electronic components (hereinafter referred to as components) P onto the wiring pattern which is formed on the board S by the printer 6, the storage container 2 stores members which are necessary for the work in the board work machine, and the unmanned conveyance vehicle 100 serves as a replenishing device which automatically performs the replenishing of members between the board work machines and the storage container 2 and the collection of used members.

The printers 6 and the component mounting machines 10 which serve as the board work machines are arranged along the board conveyance direction (the X-axis direction) to configure one component mounting line. As illustrated in FIG. 1, the component mounting system 1 of the present example is configured by two rows of component mounting lines which are distanced by a predetermined distance in a direction (the Y-axis direction) which is orthogonal to the board conveyance direction. In the component mounting system 1, a U-shaped traveling line L having two linear sections along the two rows of component mounting lines 1 and an arc section joining both linear sections is set. The unmanned conveyance vehicle 100 is capable of traveling along the traveling line L. In the present example, a U-shaped line is set as the traveling line L of the unmanned conveyance vehicle 100; however, naturally, any traveling line may be set.

As illustrated in FIG. 3, the component mounting machine 10 is provided with a base 11 and a main body frame 12 which is supported by the base 11. As illustrated in FIGS. 2 and 3, on the inside of the main body frame 12, the component mounting machine 10 is provided with a component supply device 20, backup devices 22A and 22B, a head 30, an XY robot 40, and the like. The component supply device 20 supplies the components P, the backup devices 22A and 22B back up the boards S which are conveyed from the board conveyance devices 4A and 4B from the rear face side, the head 30 is for picking up (sucking) the components P which are supplied from the component supply device 20 and mounting the components P on the boards S using suction nozzles, and the XY-robot 40 moves the head 30 in the XY-directions. The component mounting machine 10 is provided with a mark camera 26 which is provided on the head 30 and is capable of imaging fiducial marks which are attached to the board S from above and a parts camera 28 which is installed on a support table 14 and is capable of imaging the component P which is sucked by a suction nozzle from below. The component mounting machine 10 performs correction of an actual mounting position when mounting the component P onto the board S by processing the captured image to recognize the position of an imaging target object.

For example, the component supply device 20 is provided with a tape feeder 21 which is capable of supplying components to a suction position by intermittently feeding a tape in which cavities that accommodate components P are formed every predetermined interval using a sprocket which is rotationally driven by a motor. The tape feeder 21 is detachably provided with respect to a feeder support table 16 which is formed on a front face portion of the main body frame 12.

As illustrated in FIG. 2 or 3, the XY-robot 40 is provided with a Y-axis guide rail 43 which is provided along the Y-axis direction on a top level of the main body frame 12 on the base 11, a Y-axis slider 44 which is capable of moving along the Y-axis guide rail 43, an X-axis guide rail 41 which is provided along the X-axis direction on, a lower face of the Y-axis slider 44, and an X-axis slider 42 which is capable of moving along the X-axis guide rail 41. The head 30 is provided on the X-axis slider 42. The component mounting machine 10 IS capable of moving the head 30 (the suction nozzle) to an arbitrary position on the XY-plane by driving the XY-robot 40.

Although not illustrated, the head 30 is provided with a Z-axis actuator which is capable of moving the suction nozzle in the Z-axis direction and a θ-axis actuator which is capable of rotating the suction nozzle. The suction nozzle sucks the component P using the negative pressure from a vacuum pump which is not illustrated.

When the boards S are conveyed by the board conveyance devices 4A and 4B, the component mounting machine 10 which is configured in this manner backs up the boards S which are conveyed using each of the backup devices 22A and 22B and supplies the components P to the component supply device 20 (the tape feeder 21). Next, the component mounting machine 10 causes the suction nozzle to suck the component by moving the X-axis slider 42 and the Y-axis slider 44 such that the suction nozzle comes to directly above the component P which is supplied, lowering the suction nozzle, and causing a negative pressure to act on the suction port of the suction nozzle. When the component P is sucked by the suction nozzle, the component mounting machine 10 lifts the suction nozzle and moves each of the sliders 42 and 44 such that the sucked component P comes to directly above the mounting position of the board S. Then, the component mounting machine 10 lowers the suction nozzle until the component P is pushed against the mounting position of the board S and releases the suction of the component by the suction nozzle by causing a positive pressure to act on the suction port of the suction nozzle. The component mounting machine 10 mounts each of the components onto the board S by repeating these operations.

Figure 4:
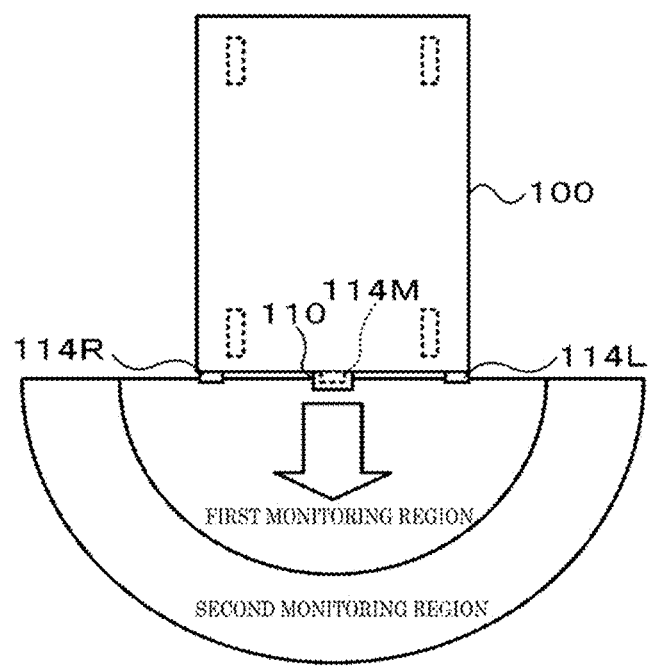
FIG. 4 is an explanatory diagram illustrating a monitoring region of the unmanned conveyance vehicle 100.
Figure 5:
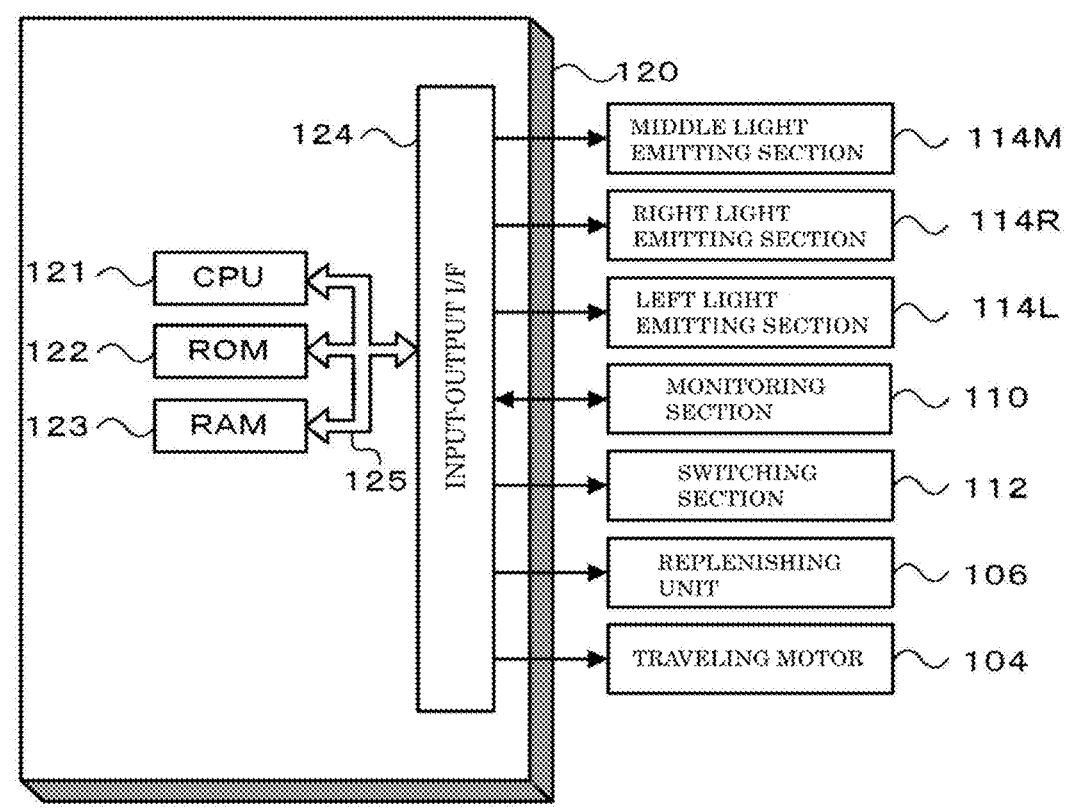
FIG. 5 is a block diagram illustrating the schematic configuration of a control device 120 of the unmanned conveyance vehicle 100.

Next, description will be given of the unmanned conveyance vehicle 100. FIG. 4 is an explanatory diagram illustrating the monitoring region of the unmanned conveyance vehicle 100, and FIG. 5 is a block diagram illustrating the schematic configuration of the control device 120 of the unmanned conveyance vehicle 100.

In the present example, the unmanned conveyance vehicle 100 is configured as a tape feeder replenishing device which replenishes the component mounting machine 10 with the tape feeder 21 and collects the used tape feeder 21. The unmanned conveyance vehicle 100 is provided with a traveling table 102 (refer to FIG. 3), a replenishing unit 106 (refer to FIG. 3), and the control device 120 (refer to FIG. 5). In the traveling table 102, a traveling motor 104 (refer to FIG. 5) is linked to wheels 101, the replenishing unit 106 is installed on the traveling table 102, and the control device 120 controls the entire vehicle. As illustrated in FIG. 3, the unmanned conveyance vehicle 100 is provided with a monitoring section 110, a switching section 112, and a light emitting section 114. The monitoring section 110 is for monitoring whether or not an obstacle is present at the front in the vehicle progress direction, the switching section 112 is for switching the monitoring region of the monitoring section 110, and the light emitting section 114 is for illuminating the front in the vehicle advancing direction.

The unmanned conveyance vehicle 100 stores the traveling line L in advance and performs automatic traveling by performing drive control of the traveling motor 104 while measuring the travel distance and the travel posture on the traveling line L to estimate the host position. For example, the unmanned conveyance vehicle 100 may be guided using a well-known guidance system such as an electromagnetic guidance system or a laser guidance system.

The replenishing unit 106 is capable of accommodating multiple tape feeders 21 in a state in which the tape feeders 21 are lined up in the X-axis direction. The replenishing unit 106 is provided with a feeder feeding mechanism (not illustrated) which is capable of attaching the tape feeder 21 in an empty slot of the feeder support table 16 of the component mounting machine 10 by gripping the tape feeder 21 which is accommodated inside the unit and feeding out the tape feeder 21 in the Y-axis direction, and pulls out the used tape feeder 21 which is attached in the feeder support table 16 in the Y-axis direction to collect the tape feeder 21 in the unit.

For example, the monitoring section 110 is configured as a laser scanner which measures the detection of an obstacle (an operator or the like) and the distance to the obstacle by irradiating the monitoring region with a laser and measuring the time until the laser returns. As illustrated in FIG. 4, the monitoring section 110 includes a first monitoring region which monitors obstacles in which the distance from the monitoring section 110 is up to a first distance and a second monitoring region which monitors obstacles in which the distance from the monitoring section 110 is from the first distance up to a second distance. The first monitoring region is a stopping region in which the traveling of the unmanned conveyance vehicle 100 is stopped when an obstacle is detected and the second monitoring region is a warning region in which a predetermined warning is emitted when an obstacle is detected.

The switching section 112 is configured as a moving mechanism which is capable of moving the monitoring section 110 to the left and the right. The switching section 112 is capable of switching the monitoring region (the first monitoring region and the second monitoring region) to the right side in the vehicle progress direction by moving the monitoring section 110 to the right, and is capable of switching the monitoring region (the first monitoring region and the second monitoring region) to the left side in the vehicle advancing direction by moving the monitoring section 110 to the left.

For example, the light emitting section 114 is configured as a semiconductor laser device which amplifies and emits a light of a visible light region, and as illustrated in FIG. 3, is provided with a right light emitting section 114R which illuminates the right portion in the vehicle progress direction, a middle light emitting section 114M which illuminates the middle portion in the vehicle progress direction, and a left light emitting section 114L which illuminates the left portion in the vehicle advancing direction.

The control device 120 is configured as a microprocessor centered on the CPU 121, and in addition to the CPU 121, is provided with a ROM 122, a RAM 123, an input and output interface 124, and the like. These are electrically connected to each other via a bus 125. The detection signal from the monitoring section 110 and the like are input to the control device 120 via the input and output interface 124. Each of the drive signals to a middle light emitting section 114M, the right light emitting section 114R, and the left light emitting section 114L, the drive signal to the replenishing unit 106, the drive signal to the traveling motor 104, and the like are output from the control device 120 via the input and output interface 124.

Figure 6:
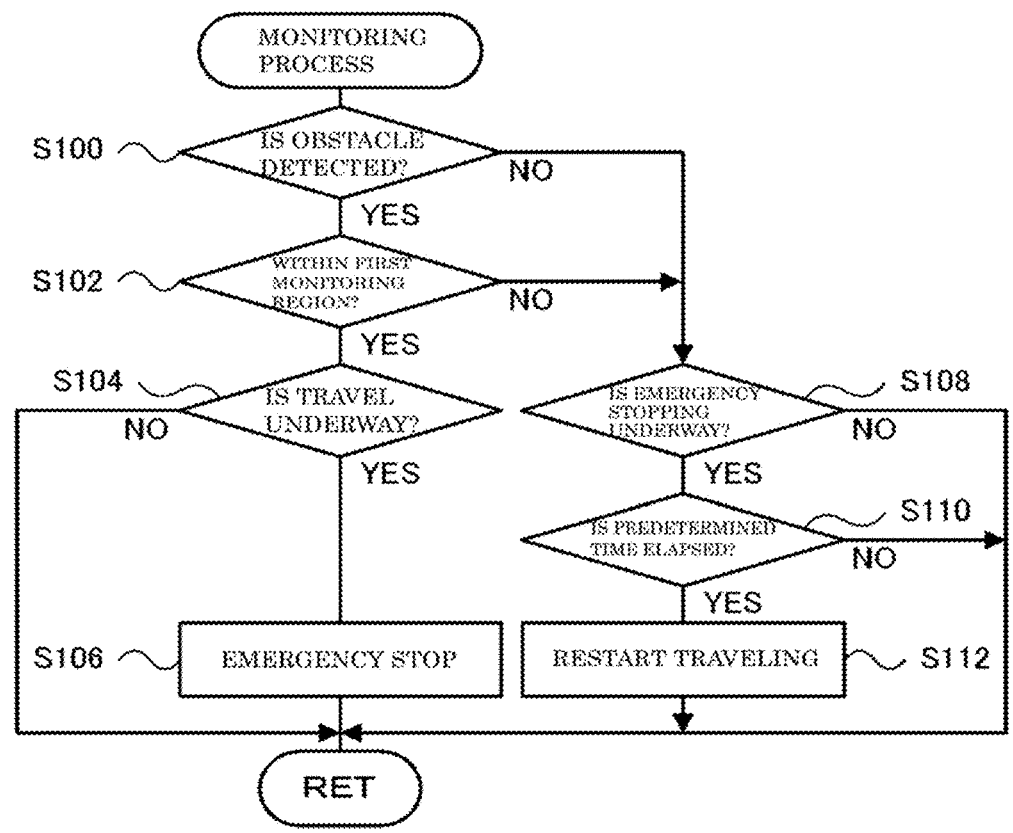
FIG. 6 is a flowchart illustrating an example of a monitoring process which is performed by a CPU 121 of the control device 120.

The operations of the unmanned conveyance vehicle 100 which is configured in this manner, particularly, a monitoring process, a monitoring region switching process, a light emission control process, and a light emission switching process will be described. FIG. 6 is a flowchart illustrating an example of the monitoring process which is performed by the CPU 121 of the control device 120. This process is performed repeatedly every predetermined time.

When the monitoring process of FIG. 6 is performed, the CPU 121 of the control device 120 determines whether or not an obstacle is detected by the monitoring section 110 (S100). When the CPU 121 determines that an obstacle is detected, the CPU 121 determines whether or not the obstacle is within the first monitoring region (S102). When the CPU 121 determines that the obstacle is within the first monitoring region, the CPU 121 determines whether or not travel is underway (S104), and if travel is underway, the CPU 121 performs an emergency stop (S106) and ends the monitoring process, and if travel is not underway (if stopping is underway), the CPU 121 ends the monitoring process with the emergency stop state maintained. Meanwhile, when the CPU 121 determines that an obstacle is not detected in S100 or determines that the obstacle is within the second monitoring region and not the first monitoring region in S102, the CPU 121 determines whether or not emergency stop is underway (S108), and when the CPU 121 determines that emergency stop is underway, the CPU 121 determines whether or not a predetermined time (for example, two seconds) is elapsed (S110). In other words, after detecting an obstacle within the first monitoring region and performing the emergency stop, the CPU 121 determines whether or not a predetermined time is elapsed since the obstacle is no longer detected within the first monitoring region. When the CPU 121 determines that the predetermined time is elapsed, the CPU 121 restarts the traveling (S112) and ends the monitoring process. When the CPU 121 determines that the emergency stop is not underway in S108 or determines that the predetermined time is not elapsed in S110 even if the emergency stop is underway, the CPU 121 ends the monitoring process in this state.

Figure 7:
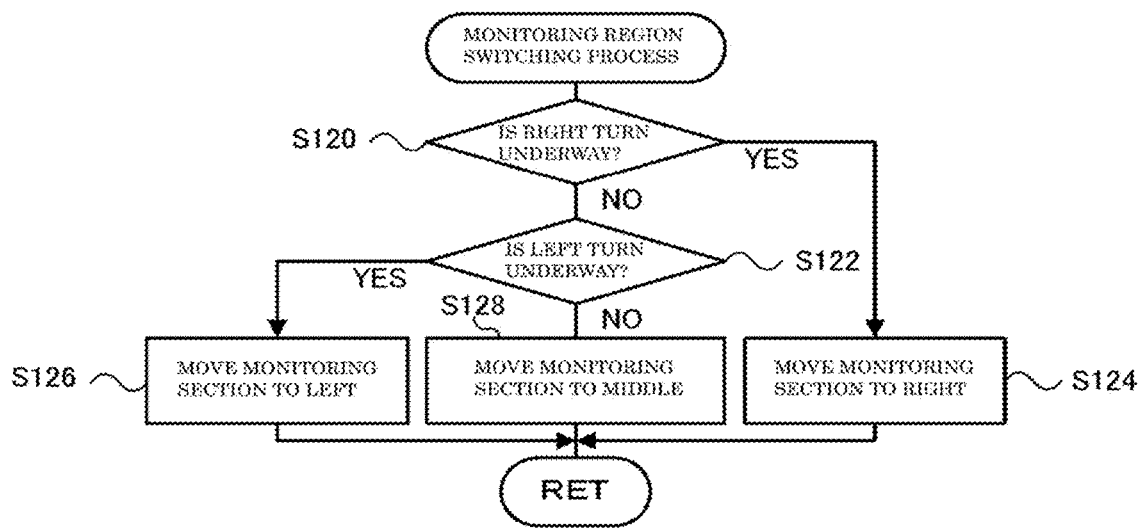
FIG. 7 is a flowchart illustrating an example of a monitoring region switching process which is performed by the CPU 121 of the control device 120.

Next, description will be given of the monitoring region switching process. FIG. 7 is a flowchart illustrating an example of the monitoring region switching process which is performed by the CPU 121 of the control device 120. When the monitoring region switching process of FIG. 7 is performed, the CPU 121 determines whether or not the unmanned conveyance vehicle 100 is turning right (S120) or whether or not the unmanned conveyance vehicle 100 is turning left (S122), respectively. For example, it is possible to perform the processes of S120 and S122 by determining whether or not the current position on the traveling line L is within an arc section. When the CPU 121 determines that a right turn is underway, the CPU 121 moves the monitoring section 110 to the right (S124), and when the CPU 121 determines that a left turn is underway, the CPU 121 moves the monitoring section 110 to the left (S126), and when the CPU 121 determines that neither a right turn nor a left turn is underway, that is, that straight progress is underway, the CPU 121 moves the monitoring section 110 to the center (S128) and ends the monitoring region switching process.

Figure 8:
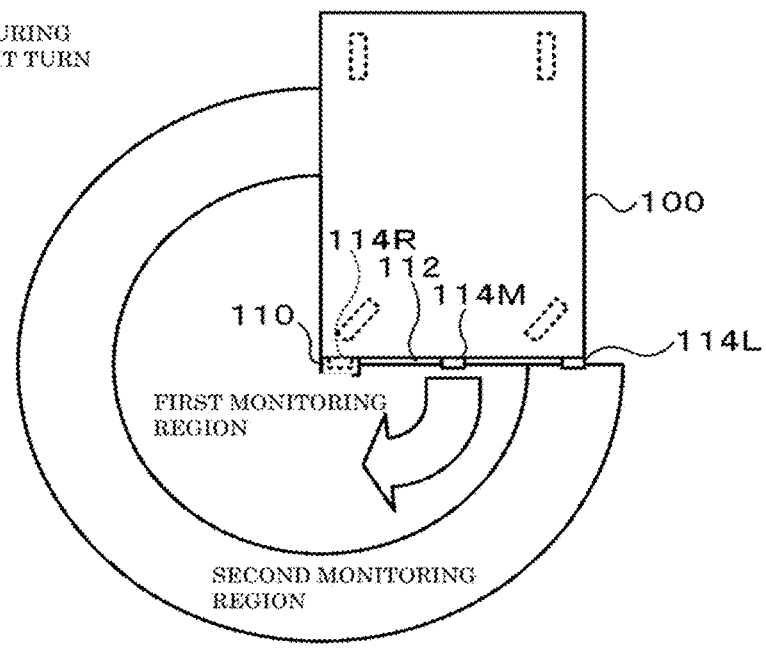
FIG. 8 is an explanatory diagram illustrating a state in which the monitoring region is switched when changing the advancing direction of the unmanned conveyance vehicle 100.
Figure 8:
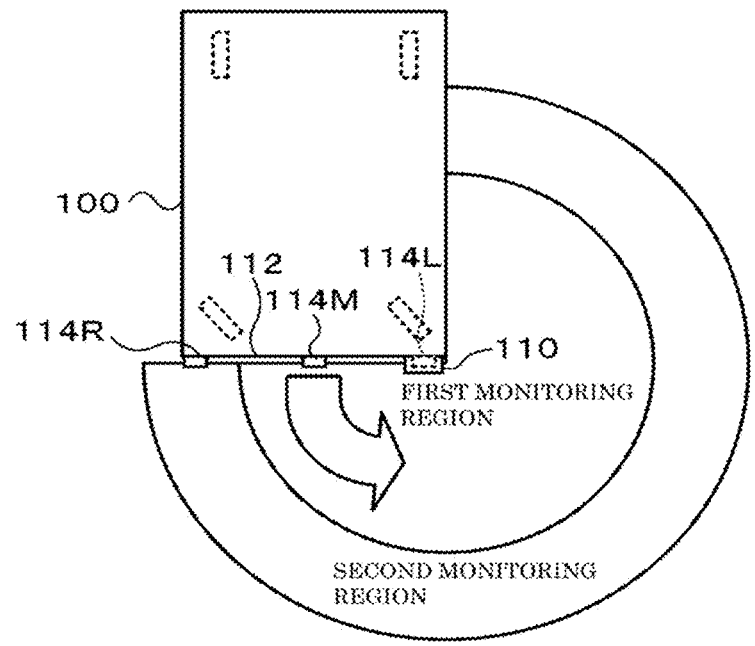

FIG. 8 is an explanatory diagram illustrating a state in which the monitoring region is switched when changing the advancing direction of the unmanned conveyance vehicle 100. As illustrated, when the unmanned conveyance vehicle 100 is turning right, the first monitoring region and the second monitoring region are switched to the right portion in the advancing direction by moving the monitoring section 110 to the right portion using the switching section 112, and when the unmanned conveyance vehicle 100 is turning left, the first monitoring region and the second monitoring region are switched to the left portion in the progress direction by moving the monitoring section 110 to the left portion using the switching section 112.

Figure 9:
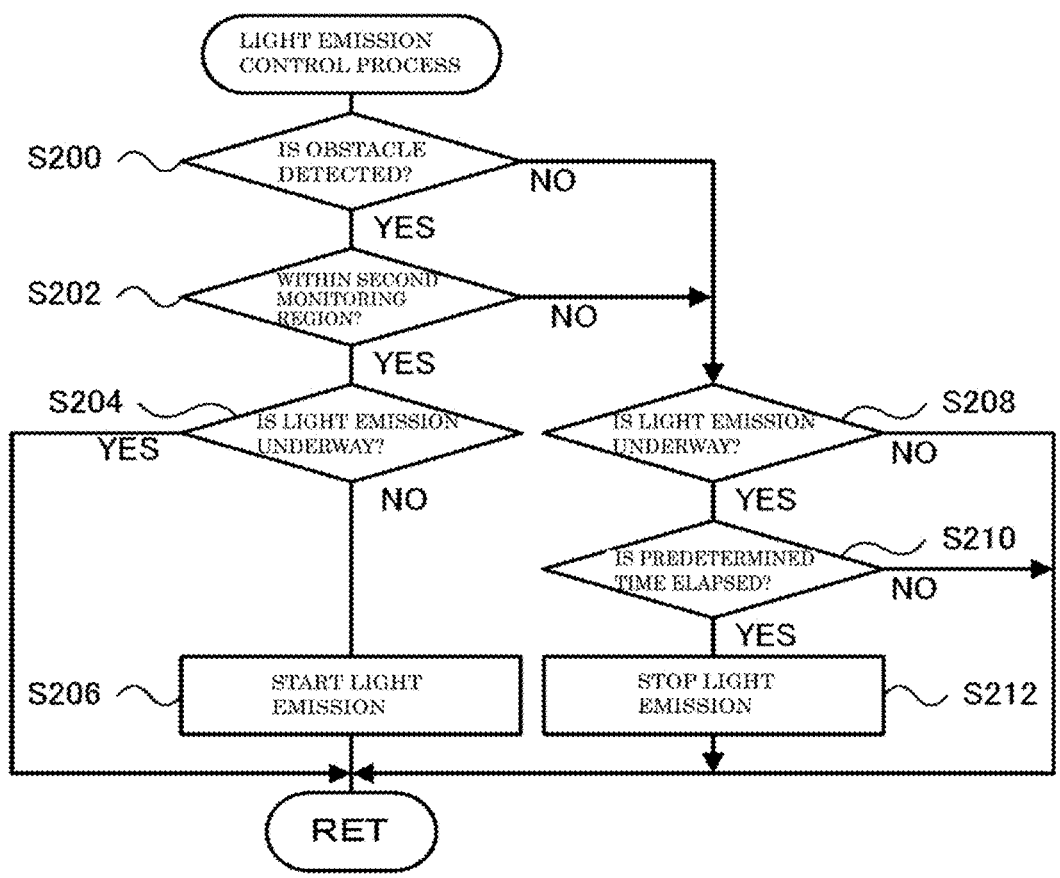
FIG. 9 is a flowchart illustrating an example of a light emission control process which is performed by the CPU 121 of the control device 120.

Next, description will be given of the light emission control process. FIG. 9 is a flowchart illustrating an example of the light emission control process which is performed by the CPU 121 of the control device 120. When the light emission control process of FIG. 9 is performed, first, the CPU 121 determines whether or not an obstacle is detected by the monitoring section 110 (S200). When the CPU 121 determines that an obstacle is detected, the CPU 121 determines whether or not the obstacle is within the second monitoring region (S202). When the CPU 121 determines that the obstacle is within the second monitoring region, the CPU 121 determines whether or not the light emitting section 114 is emitting light (S204), and if the light emitting section 114 is not emitting light, the CPU 121 starts the light emission (S206) and ends the light emission control process, and if the light emitting section 114 is emitting light, the CPU 121 ends the light emission control process with the state of light being emitted maintained. Here, in the present example, the light emitting section 114 includes the left light emitting section 114L, the middle light emitting section 114M, and the right light emitting section 114R, and the switching of the light emission is performed by the light emission switching process which is described later. Meanwhile, when the CPU 121 determines that an obstacle is not detected in S200 or determines that the obstacle is within the first monitoring region and not the second monitoring region in S202, the CPU 121 determines whether or not light emission is underway (S208), and when the CPU 121 determines that light emission is underway, the CPU 121 determines whether or not a predetermined time (for example, five seconds) is elapsed (S210). In other words, after detecting an obstacle within the second monitoring region and starting the light emission of the light emitting section 114, the CPU 121 determines whether or not a predetermined time is elapsed since the obstacle is no longer detected within the second monitoring region. When the CPU 121 determines that the predetermined time is elapsed, the CPU 121 stops the light emission (S212) and ends the light emission control process. In the present example, even if an obstacle enters the first monitoring region after an obstacle is detected within the second monitoring region and the light emission of the light emitting section 114 is started, when a predetermined time is elapsed since the obstacle is no longer detected within the second monitoring region, the light emission is stopped (the traveling is stopped); however, the light emission may be stopped when a predetermined time is elapsed since the obstacle is no longer detected within both the first monitoring region and the second monitoring region. When the CPU 121 determines that light emission is not underway in S208 or that even if the light emission is underway a predetermined time is not elapsed in S210, the CPU 121 ends the light emission control process in this state.

Figure 10:
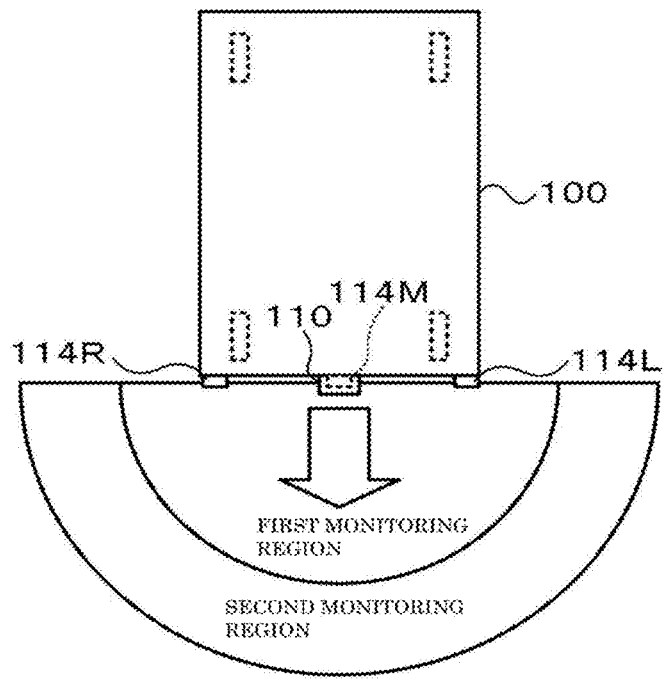
FIG. 10 is an explanatory diagram illustrating a state of the light emission of the unmanned conveyance vehicle 100 during obstacle detection.
Figure 10:
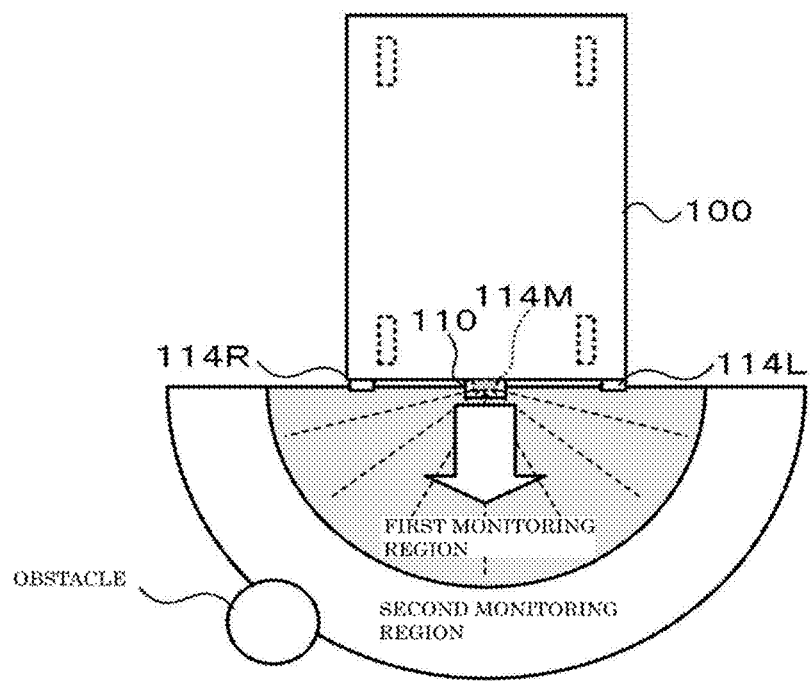

FIG. 10 is an explanatory diagram illustrating a state of the light emission of the unmanned conveyance vehicle 100 during obstacle detection. The unmanned conveyance vehicle 100 ordinarily travels in a state in which the light emission of the light emitting section 114 is stopped (refer to FIG. 10(*a*)), and when the monitoring section 110 detects an obstacle within the second monitoring region while travel is underway, the light emission of the light emitting section 114 is started to illuminate the first monitoring region (refer to FIG. 10(*b*)). As described earlier, since the first monitoring region is defined as a stopping region in which the unmanned conveyance vehicle 100 performs the emergency stop when an obstacle is detected, after entering the second monitoring region of the unmanned conveyance vehicle 100, the operator is capable of recognizing the distance at which, when reached by the unmanned conveyance vehicle 100, the unmanned conveyance vehicle 100 will perform the emergency stop. In this manner, the unmanned conveyance vehicle 100 achieves energy savings and life extension to the light emitting section 114 by only emitting light in a case in which doing so is necessary.

Figure 11:
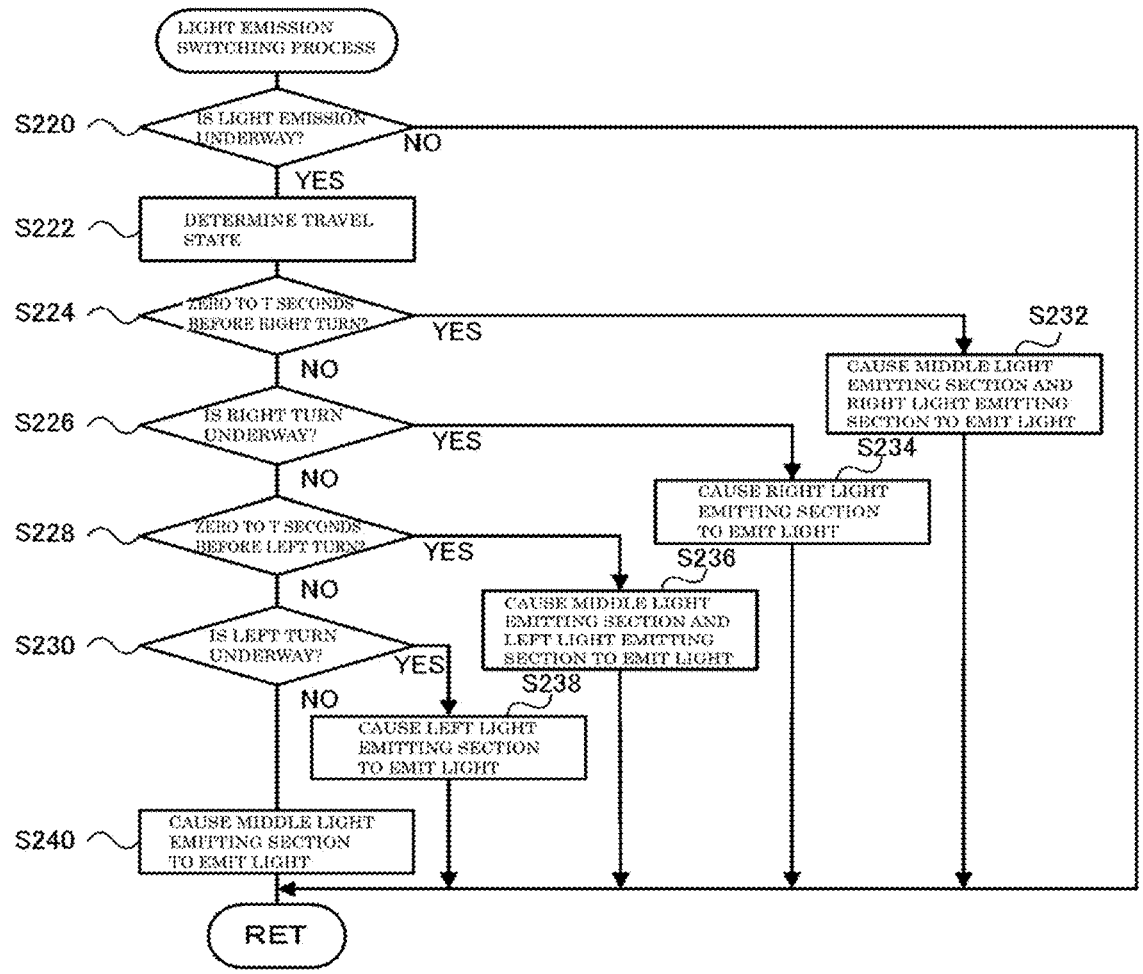
FIG. 11 is a flowchart illustrating an example of a light emission switching process which is performed by the CPU 121 of the control device 120.

Next, description will be given of the light emission switching process. FIG. 11 is a flowchart illustrating an example of the light emission switching process which is performed by the CPU 121 of the control device 120. When the light emission switching process of FIG. 11 is performed, the CPU 121 first determines whether or not any of the left light emitting section 114L, the middle light emitting section 114M, and the right light emitting section 114R which serve as the light emitting section 114 are emitting light (S220). When the CPU 121 determines that none of the left light emitting section 114L, the middle light emitting section 114M, and the right light emitting section 114R are emitting light, the CPU 121 ends the light emission switching process in this state. Meanwhile, when the CPU 121 determines that any of the left light emitting section 114L, the middle light emitting section 114M, and the right light emitting section 114R are emitting light, the CPU 121 determines the current travel state of the unmanned conveyance vehicle 100 (S222), and as a result of the determination, the CPU 121 determines whether or not it is zero seconds to T seconds (for example, three seconds) before a right turn (S224), whether or not a right turn is underway (S226), whether or not it is zero seconds to T seconds before a left turn (S228), and whether or not a left turn is underway (S230), respectively. Here, it is possible to perform the process of S222 by determining whether or not the current position on the traveling line L is within an arc section and whether or not the current position is within a predetermined distance in front of the arc section, for example. When the CPU 121 determines that it is zero seconds to T seconds before a right turn, the CPU 121 causes the middle light emitting section 114M and the right light emitting section 114R to emit light (S232), when the CPU 121 determines that a right turn is underway, the CPU 121 causes only the right light emitting section 114R to emit light (S234), when the CPU 121 determines that it is zero seconds to T seconds before a left turn, the CPU 121 causes the middle light emitting section 114M and the left light emitting section 114L to emit light (S236), when the CPU 121 determines that a left turn is underway, the CPU 121 causes only the left light emitting section 114L to emit light (S238), and when the CPU 121 determines that none of being zero seconds to T seconds before a right turn, a right turn being underway, being zero seconds to T seconds before a left turn, or a left turn being underway, the CPU 121 causes only the middle light emitting section 114M to emit light (S240) and ends the light emission switching process.

Figure 12:
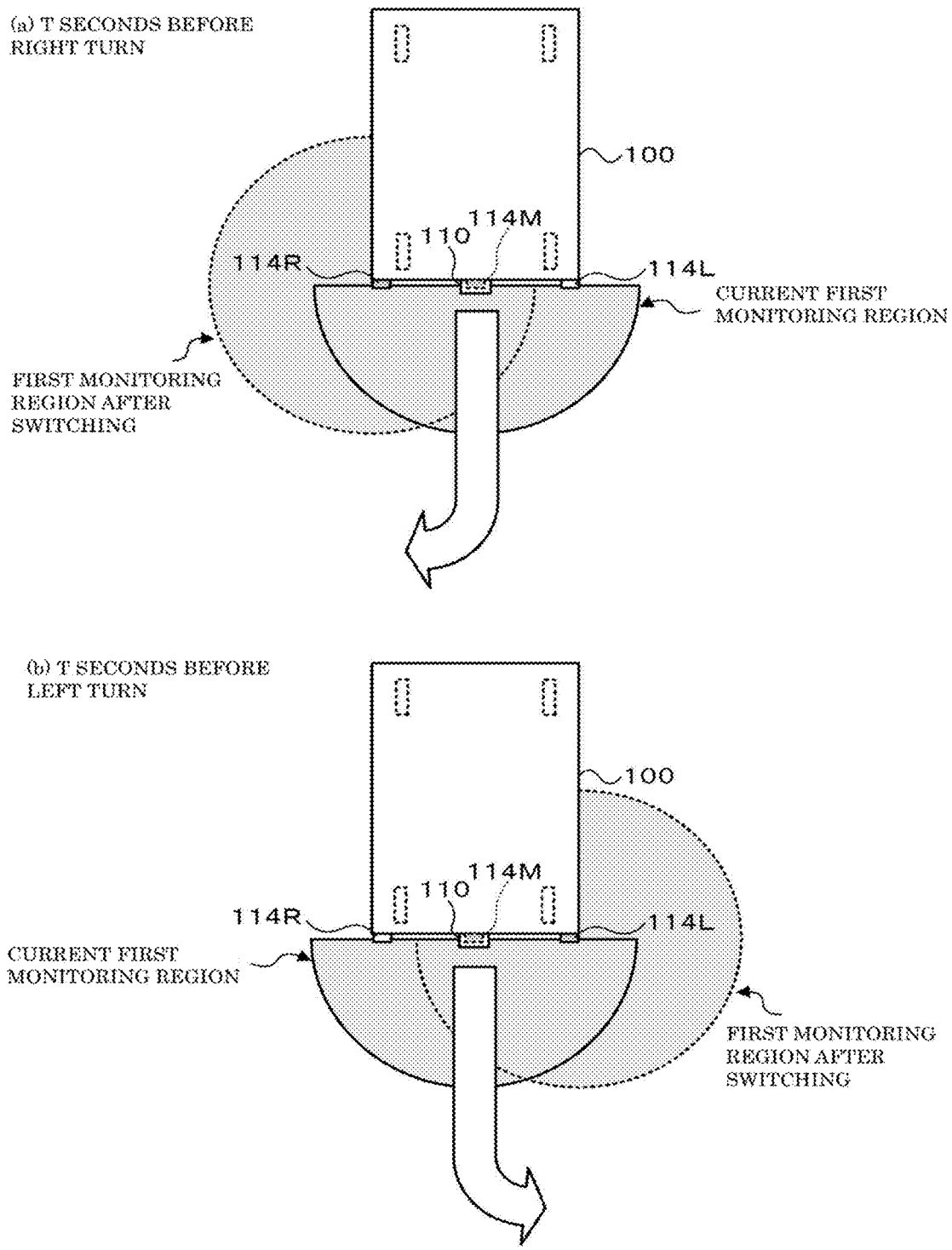
FIG. 12 is an explanatory diagram illustrating a state in which the light emission region is switched before the unmanned conveyance vehicle 100 changes the advancing direction.

FIG. 12 is an explanatory diagram illustrating a state in which the light emission region is switched before the unmanned conveyance vehicle 100 changes the advancing direction. When it is T seconds (3 seconds) before a right turn while the unmanned conveyance vehicle 100 is illuminating the current first monitoring region through the light emission of the middle light emitting section 114M, the unmanned conveyance vehicle 100 causes the right light emitting section 114R to emit light in addition to the middle light emitting section 114M and illuminates both the current (progress underway) first monitoring region and the region which will become the first monitoring region after changing (right turn underway) (refer to FIG. 12(*a*)). When it is T seconds (3 seconds) before a left turn while the unmanned conveyance vehicle 100 is illuminating the current first monitoring region through the light emission of the middle light emitting section 114M, the unmanned conveyance vehicle 100 causes the left light emitting section 114L to emit light in addition to the middle light emitting section 114M and illuminates both the current (progress underway) first monitoring region and the region which will become the first monitoring region after changing (left turn underway) (refer to FIG. 12(*b*)). Accordingly, since the operator is capable of ascertaining the right turning and the left turning of the unmanned conveyance vehicle 100 in advance, the operator can reduce entering the first monitoring region of the unmanned conveyance vehicle 100 and the unmanned conveyance vehicle 100 performing the emergency stop.

The unmanned conveyance vehicle 100 of the example which is described above includes, as monitoring regions for detecting obstacles, the monitoring section 110 which includes a first monitoring region and a second monitoring region which is capable of detecting obstacles that are more distant than the first monitoring region, and the light emitting section 114 which emits light in the first monitoring region, in which when an obstacle is detected within the first monitoring region, a vehicle is caused to perform an emergency stop. Ordinarily, when the unmanned conveyance vehicle 100 stops the light emission of the light emitting section 114 and detects an obstacle within the second monitoring region, the unmanned conveyance vehicle 100 causes the light emitting section 114 to emit light. Accordingly, when the operator enters the second monitoring region, the operator is capable of recognizing the distance at which, when reached by the unmanned conveyance vehicle 100, the unmanned conveyance vehicle 100 will perform the emergency stop. Since the light emitting section 114 emits light only in a case in which doing so is necessary, it is possible to obtain energy savings and life extension of the light emitting section 114. Since the unmanned conveyance vehicle 100 switches the monitoring region (the first monitoring region and the second monitoring region) and the light emission of the light emitting section 114 to the right portion in the progress direction during a right turn and switches the monitoring region (the first monitoring region and the second monitoring region) and the light emission of the light emitting section 114 to the left portion in the progress direction during a left turn, the unmanned conveyance vehicle 100 is capable of appropriately detecting an obstacle even when the advancing direction is being changed and of illuminating the first monitoring region. Furthermore, the unmanned conveyance vehicle 100 illuminates both the current (progress underway) first monitoring region and the region which will become the first monitoring region after changing (right turn underway) zero seconds to T seconds before a right turn, and illuminates both the current (progress underway) first monitoring region and the region which will become the first monitoring region after changing (left turn underway) zero seconds to T seconds before a left turn. Accordingly, since the operator is capable of ascertaining the right turning and the left turning of the unmanned conveyance vehicle 100 in advance, the operator can effectively reduce entering the first monitoring region of the unmanned conveyance vehicle 100 and the unmanned conveyance vehicle 100 performing the emergency stop.

In the unmanned conveyance vehicle 100 of the example, the detection of an obstacle in the first monitoring region and the detection of an obstacle in the second monitoring region are performed by using one monitoring section 110 (sensor); however, the detection may be performed using separate monitoring sections (sensors), respectively.

In the unmanned conveyance vehicle 100 of the example, the monitoring region (the first monitoring region and the second monitoring region) is switched in accordance with the change in the advancing direction; however, the monitoring region may not be switched. The disclosure may be applied to an unmanned conveyance vehicle which does not change the advancing direction.

In the unmanned conveyance vehicle 100 of the example, a configuration is adopted which enables the switching to the left and the right of the monitoring region by the switching section 112 and switching to the left and the right of the light emission region by the light emitting section 114 (the left light emitting section 114L and the right light emitting section 114R); however, in an unmanned conveyance vehicle which only performs right turns, a configuration may be adopted which disables the switching to the left portion of the monitoring region and the switching to the left portion of the light emission region, and n an unmanned conveyance vehicle which only performs left turns, a configuration may be adopted which disables the switching to the right portion of the monitoring region and the switching to the right portion of the light emission region.

In the unmanned conveyance vehicle 100 of the example, the unmanned conveyance vehicle 100 illuminates both the current (progress underway) first monitoring region and the region which will become the first monitoring region after changing (right turn underway) zero seconds to T seconds before a right turn, and illuminates both the current (progress underway) first monitoring region and the region which will become the first monitoring region after changing (left turn underway) zero seconds to T seconds before a left turn; however, the configuration is not limited thereto, and the unmanned conveyance vehicle 100 may illuminate only one of the regions, for example, only the region which will become the first monitoring region after the change.

In the unmanned conveyance vehicle 100 of the example, the three light emitting sections 114L, 114M, and 114R are provided as the light emitting section 114; however, the configuration is not limited thereto, and a single light emitting section may be used, or the light emission direction may be changed according to the switching of the monitoring region. In the example, a semiconductor laser is used as the light emitting section 114; however, the configuration is not limited thereto, for example, any light source, such as an LED, may be used as long as it is possible to illuminate the first monitoring region and it is possible to switch between the light being on and the light being off.

In the unmanned conveyance vehicle 100 of the example, a configuration is adopted in which in a case in which an obstacle is not detected within the second monitoring region, the light emitting section 114 is not caused to emit light, and in a case in which an obstacle is detected within the second monitoring region, the light emitting section 114 is caused to emit light; however, a configuration may be adopted in which, while the advancing direction is being changed or when it is within a predetermined time of before the changing of the advancing direction, the light emitting section 114 is caused to emit light regardless of whether or not an obstacle is detected within the second monitoring region. In this case, while the advancing direction is being changed or when it is within a predetermined time before the changing of the advancing direction, the detection of an obstacle within the second monitoring region may not be performed.

In the example, the unmanned conveyance vehicle 100 is configured as a tape feeder replenishing device; however, the configuration is not limited thereto, and the unmanned conveyance vehicle 100 may be configured as a tray feeder replenishing device which is capable of replenishing and collecting tray feeders with respect to a component mounting machine which is capable of attaching the tray feeders which supply components using a tray, the unmanned conveyance vehicle 100 may be configured as, a waste tape collecting device which collects waste tape of the component mounting machine 10 which, on the inside of the base 11, is provided with a waste tape box which collects the waste tape after the components are taken out from the tape, or the like, and the unmanned conveyance vehicle 100 may be used in the replenishing and collecting of the members of any board work machine. It is also possible to apply the disclosure to a use other than the replenishing and the collecting of members of a board work machine.

Here, a description will be given of the correspondence relationship between the main elements of the present example and the main elements of the disclosure. In other words, the unmanned conveyance vehicle 100 corresponds to "a moving body," the monitoring section 110 (the laser scanner) and the switching section 112 correspond to "detection means," the light emitting section 114 (the left light emitting section 114L, the middle light emitting section 114M, and the right light emitting section 114R) corresponds to "light emitting means," and the CPU 121 of the control device 120 which performs the light emission control process of FIG. 9 and the light emission switching process of FIG. 11 corresponds to "light emission control means." The CPU 121 of the control device 120 which performs the monitoring process of FIG. 6 corresponds to "movement stopping means."

The present disclosure is not in any way limited to the example, and, needless to say, may be implemented in various modes within the scope of the present disclosure.

INDUSTRIAL APPLICABILITY

The present disclosure may be used in the manufacturing industry of moving bodies or the like.

REFERENCE SIGNS LIST

1: component mounting system, 2: storage container, 4A, 4B: board conveyance device, 6: printer, 10: component mounting machine, 11: base, 12: main body frame, 14: support table, 16: feeder support table, 20: component supply device, 21: tape feeder, 22A, 22B: backup device, 26: mark camera, 28: parts camera, 30: head, 40: XY-robot, 41: X-axis guide rail, 42: X-axis slider, 43: Y-axis guide rail, 44: Y-axis slider, 100: unmanned conveyance vehicle, 101: wheel, 102: traveling table, 104: traveling motor, 106: replenishing unit, 110: monitoring section, 112: switching section, 114: light emitting section, 114L: left light emitting section, 114M: middle light emitting section, 114R: right light emitting section, 120: control device, 121: CPU, 122: ROM, 123: RAM, 124: input and output interface, 125: bus, S: board, L: traveling line.

The invention claimed is:

1. A moving body comprising:
   detection means for enabling detection of an obstacle and operator within a first region and detection of the obstacle and operator within a second region, the second region being further from the moving body than the first region in a state in which the moving body is set as a reference;
   light emitting means for emitting visible light; and
   light emission control means for controlling the light emitting means,
   wherein when the obstacle and operator are detected within the second region by the detection means, the light emission control means controls the light emitting means to emit visible light in the first region,
   wherein when the obstacle and operator are not detected by the detection means or the obstacle and operator are detected not within the second region by the detection means, the light emission control means controls the light emitting means to not emit visible light in the first region, and
   wherein when the light emitting means is emitting visible light when the obstacle and operator are not detected by the detection means or when the obstacle and operator are detected not within the second region by the detection means, the light emission control means controls the light emitting means to stop emitting visible light after a predetermined time has elapsed.

2. The moving body according to claim 1, further comprising:
   movement stopping means for stopping movement in a case in which the obstacle and operator are detected within the first region by the detection means.

3. The moving body according to claim 1,
   wherein while an advancing direction of the moving body is being changed, the detection means is capable of changing at least the first region according to the change in the advancing direction.

4. The moving body according to claim 3,
   wherein the moving body is capable of moving along a movement route which is defined in advance, and
   the light emission control means is capable of emitting light in at least a region which will become the first region after the advancing direction of the moving body is changed before the change.

5. The moving body according to claim 1,
   wherein the moving body is a conveyance device which conveys a component supply device to an electronic component mounting machine which mounts electronic components which are supplied from the component supply device onto a board.

6. A moving body comprising:
   a laser scanner which enables detection of an obstacle and operator within a first region and detection of the obstacle and operator within a second region, the second region being further from the moving body than the first region in a state in which the moving body is set as a reference;
   a laser device which emits visible light; and
   a controller configured to control the laser device,
   wherein when the obstacle and operator are detected within the second region by the laser scanner, the controller is configured to control the laser device to emit visible light in the first region, wherein when the obstacle and operator are not detected by the laser scanner or the obstacle and operator are detected not within the second region by the laser scanner, the controller is configured to control the laser device to not emit visible light in the first region, and wherein when the laser device is emitting visible light when the obstacle and operator are not detected by the laser scanner or when the obstacle and operator are detected not within the second region by the laser scanner, the controller is configured to control the laser device to stop emitting visible light after a predetermined time has elapsed.

7. The moving body according to claim 6, wherein the controller is further configured to stop movement in a case in which the obstacle and operator are detected within the first region by the laser scanner.

8. The moving body according to claim 6, wherein while an advancing direction of the moving body is being changed, the laser scanner is capable of changing at least the first region according to the change in the advancing direction.

9. The moving body according to claim 8, wherein the moving body is capable of moving along a movement route which is defined in advance, and the controller is configured to control the laser device to emit light in at least a region which will become the first region after the advancing direction of the moving body is changed before the change.

10. The moving body according to claim 6, wherein the moving body is a conveyance device which conveys a component supply device to an electronic component mounting machine which mounts electronic components which are supplied from the component supply device onto a board.

11. The moving body according to claim 6, wherein the laser device includes a right light emitting section, a middle light emitting section, and a left light emitting section.

* * * * *